(12) United States Patent
Chimakurthy et al.

(10) Patent No.: US 7,940,076 B2
(45) Date of Patent: May 10, 2011

(54) LOCAL INTERCONNECT NETWORK TRANSCEIVER DRIVER

(75) Inventors: Lakshmi Sri Jyothi Chimakurthy, Dallas, TX (US); James Kohout, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 74 days.

(21) Appl. No.: 12/479,802

(22) Filed: Jun. 6, 2009

(65) Prior Publication Data

US 2010/0308859 A1  Dec. 9, 2010

(51) Int. Cl.
*H03K 17/16* (2006.01)
*H03K 19/003* (2006.01)
(52) U.S. Cl. .......................................... 326/27; 326/88
(58) Field of Classification Search .................. 326/27, 326/63, 68, 80–83, 30, 88
See application file for complete search history.

(56) References Cited

U.S. PATENT DOCUMENTS

| | | | | |
|---|---|---|---|---|
| 4,593,206 A * | 6/1986 | Neidorff et al. | ................. | 326/90 |
| 5,619,147 A * | 4/1997 | Hunley | ........................... | 326/26 |
| 6,288,563 B1 * | 9/2001 | Muljono et al. | ................ | 326/27 |
| 6,369,604 B1 * | 4/2002 | Schreyer et al. | ................ | 326/30 |
| 7,227,377 B2 * | 6/2007 | Kurts et al. | ..................... | 326/30 |
| 7,579,862 B2 * | 8/2009 | Bales | ............................. | 326/30 |
| 2002/0105356 A1 * | 8/2002 | Genna et al. | .................... | 326/57 |

* cited by examiner

*Primary Examiner* — Rexford N Barnie
*Assistant Examiner* — Crystal L Hammond
(74) *Attorney, Agent, or Firm* — John J. Patti; Wade J. Brady, III; Frederick J. Telecky, Jr.

(57) ABSTRACT

Various driver circuit apparatuses and methods for driving an electrical signal are disclosed herein. For example, some embodiments provide a driver circuit including a controlled-slew rate input circuit, a buffer that is connected to the controlled-slew rate input circuit, and an output driver that is connected to the buffer. The driver circuit is adapted to drive an output signal from the output driver based on an input signal to the controlled-slew rate input circuit. The impedance at the input of the output driver is lower than the impedance at the output of the controlled-slew rate input circuit.

8 Claims, 2 Drawing Sheets

LOCAL INTERCONNECT NETWORK TRANSCEIVER DRIVER

BACKGROUND

Vehicles such as automobiles have become increasingly sophisticated, with a large number of computer controlled and monitored sensors, switches, motors and lamps. Electrical wiring harnesses in automobiles were complex and expensive components requiring a great deal of space and labor to install, even before the shift to computerization. Wiring harnesses are also a common point of failure that are notoriously difficult to diagnose and repair because of their complexity and their placement in inaccessible and tightly packed locations. The environment in which the wiring harnesses are placed is extremely inhospitable, with wide temperature variations, constant physical movement and shock when the automobile is in motion, and the exposure to dust and grime and even to moisture in the case of leaks and spills.

One common way to minimize the number of wires in a wiring harness is to connect components with a bus in a network rather than dedicating one or more wires to each component. A local interconnect network (LIN) is a bus-based network originally developed for use in automobiles, but that may be used in other applications. The LIN is generally a single wire serial broadcast network having one master and multiple slave devices. The LIN does not support collision detection, so communication on the bus is initiated only by the master device, although the slave devices may communicate directly between themselves after the master initiates a message. In addition to reducing the number of wires in wiring harnesses, the LIN includes error detection to ensure that data is transmitted correctly. Data may be transmitted and received using a universal asynchronous receiver-transmitter (UART) either included in a microcontroller or in dedicated LIN hardware or in custom integrated circuits.

A LIN is a relatively slow and low-cost network primarily used in difficult environments such as automobiles which often generate a great deal of electromagnetic interference (EMI). Thus, LIN transceivers have strict EMI performance requirements enabling them to function properly in the presence of substantial interference. The EMI performance is tested in a direct power injection (DPI) test in which high power at a wide range of frequencies is injected onto a single LIN node or pin such as the output of a LIN driver. This results in coupling to various sensitive internal nodes in the LIN driver circuit and reduces the transmission performance. The coupling from the DPI at the LIN driver output to other nodes in the system must be limited to a specified level, such as 34 dBm (decibels of measured power referenced to one milliwatt) without a capacitor on the LIN driver output or 36 dBm with a capacitor. It is difficult to achieve this level of EMI performance in a LIN using conventional driver topologies.

SUMMARY

Various driver circuit apparatuses and methods for driving an electrical signal are disclosed herein. For example, some embodiments provide a driver circuit including a controlled-slew rate input circuit, a buffer that is connected to the controlled-slew rate input circuit, and an output driver that is connected to the buffer. The driver circuit is adapted to drive an output signal from the output driver based on an input signal to the controlled-slew rate input circuit. The impedance at the input of the output driver is lower than the impedance at the output of the controlled-slew rate input circuit.

In an embodiment of the driver circuit, the controlled-slew rate input circuit is adapted to control a slew rate of the output of the controlled-slew rate input circuit.

In an embodiment of the driver circuit, the controlled-slew rate input circuit includes a current limited switch that is connected to the output of the controlled-slew rate input circuit and that is controlled by the input data signal. The impedance of the output of the controlled-slew rate input circuit is determined at least in part by the current limited switch.

In an embodiment of the driver circuit, the current limited switch includes a high side switch and a low side switch connected in series between a voltage supply and a ground. The output of the controlled-slew rate input circuit is at a node between the high side switch and the low side switch.

In an embodiment of the driver circuit, the current limited switch includes a high side controlled current source connected in series with the high side switch between the voltage supply and the output of the controlled-slew rate input circuit, and a low side controlled current source connected in series with the low side switch between the ground and the output of the controlled-slew rate input circuit.

In an embodiment of the driver circuit, the controlled-slew rate input circuit also includes a transistor having a drain connected to a voltage supply, a source connected to a ground and a gate connected to the output of the controlled-slew rate input circuit.

In an embodiment of the driver circuit, the controlled-slew rate input circuit also includes a resistor connected between the drain of the transistor and the voltage supply. The resistance of the resistor is directly proportional to the load impedance on the output signal of the output driver.

In an embodiment of the driver circuit, the controlled-slew rate input circuit also includes a capacitor connected between the drain of the transistor and the gate of the transistor.

In an embodiment of the driver circuit, the transistor in the controlled-slew rate input circuit is the same type as but smaller than a transistor in the output driver.

In an embodiment of the driver circuit, the transistor in the controlled-slew rate input circuit has a substantially same threshold voltage as the transistor in the output driver.

In an embodiment of the driver circuit, the buffer includes an amplifier having a non-inverting input connected to the data output of the controlled-slew rate input circuit and an inverting input connected to an output of the buffer. The buffer also includes a transistor having a drain connected to a voltage supply, a source connected through a resistor to a ground, and a gate connected to an output of the amplifier. The output of the buffer is at the source of the transistor.

In an embodiment of the driver circuit, the output driver includes a transistor having a source connected to a ground and a drain connected through a resistor to a voltage supply. The input of the output driver is at the gate of the transistor, and the output of the output driver is at the end of the resistor nearest the transistor.

In an embodiment of the driver circuit, the output driver also includes a first diode connected between the voltage supply and the resistor with the anode at the voltage supply, and a second diode connected between the output of the output driver and the drain of the transistor with the anode at the output of the output driver.

In an embodiment of the driver circuit, the controlled-slew rate input circuit and the buffer are powered by a first voltage supply and the output driver is powered by a second voltage supply.

Other embodiments provide methods of driving an electrical signal. A method of driving an electrical signal includes generating a first signal at a first node based on an input data signal, controlling a slew rate of the first signal, generating a second signal at a second node by buffering the first signal, and driving the electrical signal on an output based on the second signal. The second node has a lower impedance than the first node. The voltage of the second signal tracks a voltage of the first signal.

In an embodiment of the method, the first signal is generated by a current limited inverter, and the slew rate is controlled by adjusting a current level through the current limited inverter.

In an embodiment of the method, the slew rates of the first and second signals are substantially the same.

In an embodiment of the method, the voltage of the second signal tracks the voltage of the first signal at least in part due to a first transistor having a gate connected to the first node having a same threshold voltage as a second transistor having a gate connected to the second node.

An embodiment of the method also includes proportionally scaling a current through the first transistor to a current through the second transistor.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DESCRIPTION

Figure 1:
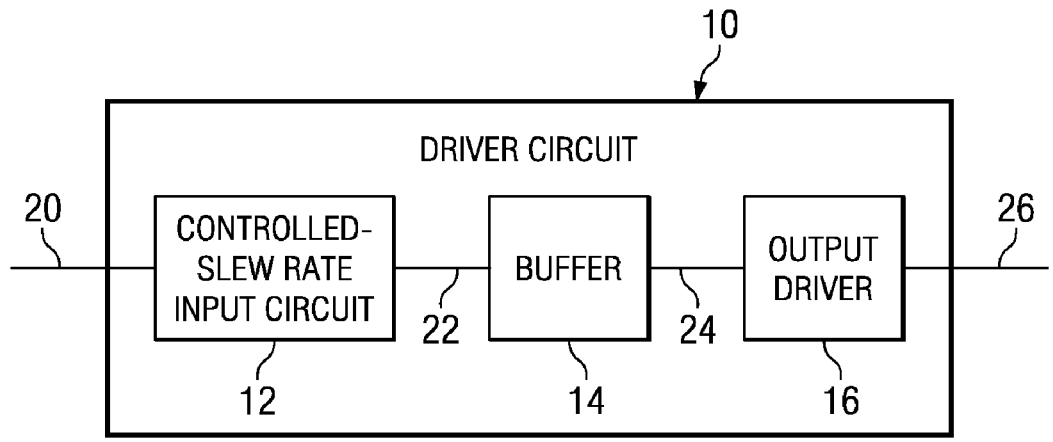
FIG. 1 depicts a block diagram of a driver circuit in accordance with some embodiments.

The drawings and description, in general, disclose various embodiments of a driver circuit and a method for driving an electrical signal. The driver is used in some embodiments as a local interconnect network (LIN) transceiver driver. The driver circuit 10 (FIG. 1) includes a controlled-slew rate input circuit 12, a buffer 14 and an output driver 16. The driver circuit 10 may be adapted to meet a number of potential requirements such as those in a LIN transceiver driver, including slew rate and duty cycle requirements and error-free performance under direct power injection (DPI) testing. The slew rate of the driver circuit 10 in response to a change at the input signal 20 is controlled by a controlled-slew rate input circuit 12. The slope or rate of change of a signal at the output 22 of the input circuit 12 can be controlled and varied as desired, including during different modes of operation or when the driver circuit 10 is in various states. The input 24 to the output driver 16 is a low impedance node, protecting the output driver 16 from noise at the output 26, such as that applied during DPI testing. (The output 26 is also referred to as a LIN node in some embodiments.) During this test, high power is injected on the output 26 of the output driver 16 at a wide range of frequencies. With a low impedance input to the output driver 16, this could result in coupling to various sensitive internal nodes in the driver circuit 10 and reduce the transmission performance. For example, the injected signal could strongly couple to the gate of the main driver FET of one embodiment of the output driver 16, causing incorrect transmissions. This is prevented in the driver circuit 10 by various features including a low impedance input 24 to the output driver 16, while maintaining a higher impedance output 22 of the input circuit 12 to effectively control the slew rate and duty cycle of the driver circuit 10.

Figure 2:
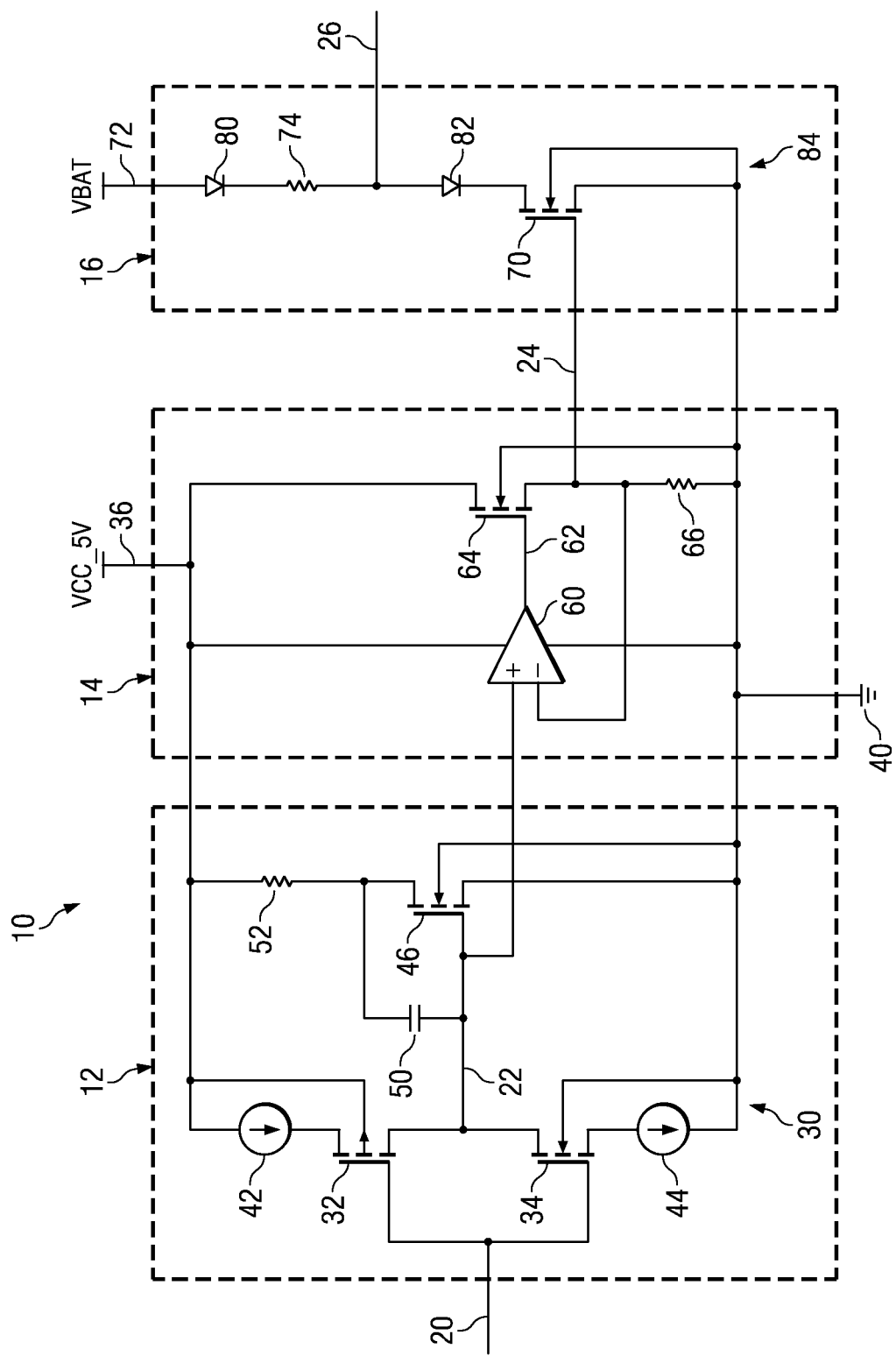
FIG. 2 depicts a schematic of a driver circuit in accordance with some embodiments.

Turning now to FIG. 2, in an embodiment of the driver circuit 10, the controlled-slew rate input circuit 12 includes a current limited switch or inverter 30 between the input signal 20 and the output 22. A P-channel metal oxide semiconductor field effect transistor (MOSFET) 32 and an N-channel MOSFET 34 are connected in series between a voltage supply 36 and ground 40. Current through the transistors 32 and 34 is limited by controllable current sources 42 and 44. One current source 42 is connected in series with the PMOS transistor 32 between the voltage supply 36 and the output 22 to control the slew rate at which the output 22 rises. Another current source 44 is connected in series with the NMOS transistor 34 between the output 22 and the ground 40 to control the slew rate at which the output 22 falls. The current through the current source 42 and current source 44 may be controlled by a controller such as an external processor or by logic circuitry (not shown) based on the state of the input signal 20 or output 26, etc. The controllable current sources 42 and 44 may be connected either above or below the transistors 32 and 34.

The driver circuit 10 is not limited to the enhancement-mode MOSFET transistors illustrated in FIG. 2, and may be adapted to use any suitable transistors or switches as desired to perform the functions and to provide the characteristics described herein without departing from the scope of the invention. The voltages used to power the driver circuit 10 may be adapted accordingly.

The input circuit 12 also includes an N-channel MOSFET transistor 46 connected between the voltage supply 36 and ground 40, with the gate connected to the output 22. A Miller capacitor 50 is connected between the gate and drain of the transistor 46 and operates in conjunction with the current sources 42 and 44 to control the slew rate of the output 22. A resistor 52 is connected between the transistor 46 and the voltage supply 36. As will be described in more detail below, the series combination of the transistor 46 and the resistor 52 is matched and scaled proportionally to components in the output driver 16, ensuring that the signal on the input 24 of the output driver 16 follow the signal on the output 22 of the input circuit 12 to meet slew rate requirements and accurately transmit the data at the input 20.

The buffer 14 is a pre-drive amplifier between the input circuit 12 and the output driver 16, driving the input 24 of the output driver 16 with a much lower impedance signal than at the output 22 of the input circuit 12. The buffer 14 includes an operational amplifier (op-amp) 60 having a non-inverting input connected to the output 22 of the input circuit 12. The output 62 of the op-amp 60 drives the gate of an N-channel MOSFET transistor 64 in the buffer 14. The drain of the transistor 64 is connected to the voltage supply 36, and a resistor 66 is connected between the source of the transistor 64 and ground 40. The use of the transistor 64 at the output of the op-amp 60 allows the input 24 of the output driver 16 to be pulled all the way up to the voltage supply 36 minus the gate to source voltage of the transistor 64. The inverting input of the op-amp 60 is connected to the output of the buffer 14 at the source of the transistor 64. The voltage at the output of the buffer 14, and hence at the input 24 of the output driver 16, tracks the voltage at the output 22 of the input circuit 12.

The output driver 16 includes an N-channel MOSFET transistor 70 having a source connected to ground 40 and drain connected to a voltage supply 72 through a pullup resistor 74. Multiple LIN nodes may be connected to the system, and the pullup resistor 74 represents the parallel resistance of the multiple different LIN nodes. When the driver circuit 10 is used as a LIN transceiver driver in an automobile, multiple voltage supplies 72 and 36 may be used, powering the output driver 16 from the 12V battery of an automobile, and powering the input circuit 12 and buffer 14 with a regulated 5V voltage supply derived from the 12V battery. In other embodiments, a single voltage supply may be used in the driver circuit 10. In LIN systems having wide voltage swings on the LIN node or output 26 of the output driver 16, a pair of diodes 80 and 82 may be connected at either side of the output 26 in the drive path 84, protecting the voltage supply 72 from current flowing toward the voltage supply 72 if the voltage on the output 26 rises above the voltage supply 72 and protecting the transistor 70 from current flowing from the drive path 84 if the voltage on the output 26 drops below the ground 40. For example, in a noisy LIN environment, the voltage on the output 26 may swing between plus and minus 40 volts.

The transistor 64 in the buffer 14 drives the input 24 of the output driver 16 strongly so that the input 24 is a low impedance node. This ensures that noise coupled from the output 26 to the input 24 of the output driver 16 will not overpower the signal from the buffer 14 and cause erroneous transmissions. The output 22 of the controlled-slew rate input circuit 12 is a higher impedance node, conserving power while increasing the controllability of the slew rate of the driver circuit 10.

In one embodiment, the slew rate to be controlled is at the output 26 of the output driver 16. This is accomplished by controlling the slew rate at the drain of the transistor 46 in the input circuit 12 based on the current sources 42 and 44 operating together with the Miller capacitor 50. The transistor 46 operates in three regions, a cutoff region when the gate to source voltage $V_{GS}$ is lower than the threshold voltage $V_T$ and the transistor 46 is off, a saturation region when the gate to source voltage $V_{GS}$ minus the threshold voltage $V_T$ is less than or equal to the drain to source voltage $V_{DS}$ and the resistance of the transistor 46 varies based on the gate voltage, and a linear region when the transistor 46 is fully on and the drain is pulled down to ground 40. In the saturation region, the capacitance on the gate of the transistor 46 is the capacitance of the Miller capacitor 50 multiplied by the gain A of the transistor 46, plus the gate to source capacitance of the transistor 46 which is much smaller. The slew rate at the drain of the transistor 46 is therefore controlled by the Miller capacitor 50 and the current sources 42 and 44, as well as the resistor 52 and the voltage of the voltage supply 36.

The slew rate at the output 26 of the output driver 16 matches that at the drain of the transistor 46 for a number of reasons. The transistor 46 in the input circuit 12 is matched to that 70 in the output driver 16, being of the same type although the transistor 70 in the output driver 16 is much larger than the transistor 46 in the input circuit 12. With matched transistors 46 and 70, and with an identical gate drive at the two nodes 22 and 24, the transistor 46 and transistor 70 have the same slew rate and duty cycle. The two transistors 46 and 70 may also be placed in close physical proximity so that their temperature is similar, keeping their threshold voltage the same as temperature varies. Furthermore, the pullup resistor 52 is scaled such that the current is proportional to that through resistor 74 based on the relative sizes of transistors 46 and 70. For example, the transistor 70 in the output driver 16 may be fifty times larger than transistor 46 and the resistor 52 in the input circuit 12 is scaled to carry the same current as resistor 74 when transistor 46 and 70 are completely on. With the transistor 46 and resistor 52 proportionally matched to the drive path 84, the effect of the Miller capacitor 50 on the slew rate can be mirrored correctly to the output driver 16 so that the output 26 has the desired characteristics.

The transistors 46 and 70 therefore have the same operating characteristics, and with the same gate drive voltage at nodes 22 and 24, the output 26 of the driver circuit 10 changes with the desired slope or slew rate as controlled at the controlled-slew rate input circuit 12. The buffer 14 or pre-drive amplifier strongly drives the input 24 of the output driver 16 with a low impedance signal from the transistor 64 and resistor 66, protecting the driver circuit 10 against noise from the output 26.

The buffer 14 is designed to have a substantially flat frequency response over the range of frequencies at which noise may occur at the output 26 of the driver circuit 10. That is, the buffer 14 should have a wide enough bandwidth to match potential noise so that the input 24 of the output driver 16 is a low impedance node for all frequencies of interest.

Figure 3:
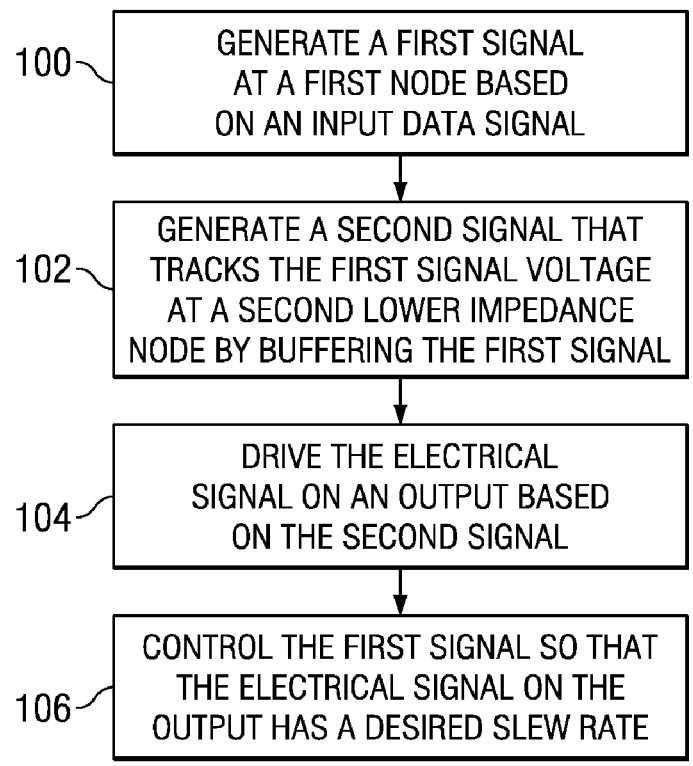
FIG. 3 depicts a flow chart of a method for driving an electrical signal in accordance with some embodiments.

An embodiment of a method for driving an electrical signal is summarized in the flow chart of FIG. 3. The method includes generating a first signal at a first node 22 based on an input data signal 20. (Block 100) A second signal is generated at a second node 24 by buffering the first signal. (Block 102) The second node 24 has a lower impedance than the first node 22 as discussed above to ensure that the second signal is not adversely affected by noise coupled from the output 26 of the driver circuit 10 or elsewhere. The voltage of the second signal tracks the voltage of the first signal, ensuring that the output 26 transitions at the correct time and with the correct slew rate. An electrical signal is driven on the output 26 based on the second signal from the second node 24. (Block 104) The first signal at the first node 22 is controlled, for example by the controlled current sources 42 and 44 and Miller capacitor 50 as described above, thereby providing the desired slew rate at the output 26 of the driver circuit 10. (Block 106)

While illustrative embodiments have been described in detail herein, it is to be understood that the concepts disclosed herein may be otherwise variously embodied and employed, and that the appended claims are intended to be construed to include such variations, except as limited by the prior art.

What is claimed is:
1. Driver circuit comprising:
   a first supply rail;
   a second supply rail;
   a controlled-slew rate input circuit having:
      a current limited switch that is coupled between an input and an output of the controlled-slew rate input circuit;
      a resistor that is coupled to the first supply rail;
      a transistor that is coupled to the resistor at its drain, the second voltage rail at its source, and the output of the controlled-slew rate input circuit at its gate; and
      a capacitor that is coupled between the drain and source of the transistor;
   a buffer that is coupled to the output of the controlled-slew rate input circuit; and
   an output driver that is coupled to the buffer and that provides an output signal, wherein a resistance of the resistor is directly proportional to a load impedance on the output signal of the output driver.
2. The driver circuit of claim 1, wherein the current limited switch further comprises a high side switch and a low side switch that are coupled in series with one another between the first and second supply rails.

3. The driver circuit of claim 2, wherein the current limited switch further comprises:
 a first current source that is coupled between the first supply rail and the high side switch; and
 a second current source that is coupled between the low side switch and the second supply rail.

4. The driver circuit of claim 1, wherein the transistor further comprises a first transistor, and wherein the resistor further comprises a first resistor, and wherein the buffer further comprises:
 an amplifier having a non-inverting input and an inverting input, wherein the non-inverting input of the amplifier is coupled to the output of the controlled-slew rate input circuit; and
 a second resistor that is coupled to the second supply rail;
 a second transistor having a drain that is coupled to the first supply rail, a source that is coupled to the second supply rail and the inverting input of the amplifier, and a gate that is coupled to an output of the amplifier.

5. The driver circuit of claim 1, wherein the transistor further comprises a first transistor, and wherein the resistor further comprises a first resistor, and wherein the driver further comprises a third supply rail, and wherein the output driver further comprises:
 a second resistor that is coupled to the third supply rail;
 a second transistor having a source that is coupled to the second supply rail and a drain that is coupled to the second resistor.

6. The driver circuit of claim 5, wherein the output driver further comprises:
 a first diode that is coupled between the third supply rail and the second resistor; and
 a second diode that is coupled between the second resistor and the drain of the second transistor.

7. The driver circuit of claim 5, wherein the first supply rail is coupled to a first voltage supply, the second supply rail is coupled to ground, and the third supply rail is coupled to a second voltage supply.

8. A driver circuit comprising:
 a controlled-slew rate input circuit;
 a buffer connected to the slew rate control circuit;
 an output driver connected to the buffer;
 wherein an impedance at an input of the output driver is lower than an impedance of an output of the controlled-slew rate input circuit;
 wherein the controlled-slew rate input circuit is adapted to control a slew rate of an output of the output driver;
 wherein the controlled-slew rate input circuit comprises:
 a high side switch and a high side current source connected in series between a first voltage supply and the output of the slew rate control circuit;
 a low side switch and a low side current source connected in series between a ground and the output of the slew rate control circuit, wherein the impedance of the controlled-slew rate input circuit output is determined at least in part on the high side current source and the low side current source;
 a first transistor having a drain connected to the first voltage supply, a source connected to the ground and a gate connected to the output of the slew rate control circuit;
 a first resistor connected between the drain of the first transistor and the first voltage supply, wherein a resistance of the first resistor is directly proportional to a load impedance at the output of the output driver; and
 a capacitor connected between the drain of the first transistor and the gate of the first transistor;
 wherein the buffer comprises:
 an amplifier having a non-inverting input connected to the output of the controlled- slew rate input circuit and an inverting input connected to an output of the buffer; and
 a second transistor having a drain connected to the first voltage supply, a source connected through a second resistor to the ground, and a gate connected to an output of the amplifier, the output of the buffer comprising the source of the second transistor;
 wherein the output driver comprises:
 a third transistor having a source connected to the ground;
 a first diode having a cathode connected to a drain of the third transistor and an anode connected to the output of the output driver;
 a third resistor connected at a first end to the output of the output driver; and
 a second diode having a cathode connected to a second end of the third resistor and an anode connected to a second voltage supply, wherein the input of the output driver comprises a gate of the third transistor; and
 wherein the first transistor and the third transistor have a same type and have a substantially same threshold voltage, and wherein the first transistor is smaller than the third transistor.

* * * * *